United States Patent [19]
Genest

[11] Patent Number: 5,726,599
[45] Date of Patent: Mar. 10, 1998

[54] DEVICE FOR MULTIPLYING A CAPACITANCE BY A VARIABLE COEFFICIENT TO ADJUST A FILTER CUT-OFF FREQUENCY

[75] Inventor: Pierre Genest, Butry Sur Oise, France

[73] Assignee: Alcatel N.V., Rijswijk, Netherlands

[21] Appl. No.: 385,476

[22] Filed: Feb. 8, 1995

[30] Foreign Application Priority Data

Feb. 9, 1994 [FR] France ............... 95 01454

[51] Int. Cl.$^6$ ............... H03K 5/00; H03G 3/02
[52] U.S. Cl. ............ 327/553; 327/552; 327/524; 330/294
[58] Field of Search ............... 327/551, 552, 327/553, 554, 555, 556, 557, 558, 108, 103, 524; 330/303, 305, 306, 107

[56] References Cited

U.S. PATENT DOCUMENTS

| | | | |
|---|---|---|---|
| 4,339,729 | 7/1982 | Jason et al. | 330/294 |
| 5,166,560 | 11/1992 | Liu | 327/524 |
| 5,317,216 | 5/1994 | Hosoya et al. | 327/553 |
| 5,327,027 | 7/1994 | Taylor | 327/524 |

FOREIGN PATENT DOCUMENTS

| | | | |
|---|---|---|---|
| 0477694 | 4/1992 | European Pat. Off. | 327/553 |
| WO93303543 | 2/1993 | WIPO . | |

OTHER PUBLICATIONS

*Electronic Design*, vol. 39, No. 5, Dec. 1991, Hasbrouck Heights, New Jersey, p. 113; J. Dunn, "Vary Capacitance to Positive or Negative".

*International Journal of electronics*, vol. 64, No. 6, Jun. 1988, London GB, pp. 941–845; Sitthichai Pookaiyaudom eet al "Efficient Circuit Implementation . . . Transconductance Amplifiers".

Primary Examiner—Timothy P. Callahan
Assistant Examiner—Dinh T. Le
Attorney, Agent, or Firm—Sughrue, Mion, Zinn, Macpeak & Seas, PLLC

[57] ABSTRACT

A device for multiplying a capacitance by a variable coefficient, for example for adjusting a cut-off frequency of a filter, includes a current amplifier for amplifying a current flowing through said capacitance. The capacitance is floating between first and second predetermined points. The current amplifier circuit includes a differential current amplifier.

20 Claims, 6 Drawing Sheets

DEVICE FOR MULTIPLYING A CAPACITANCE BY A VARIABLE COEFFICIENT TO ADJUST A FILTER CUT-OFF FREQUENCY

BACKGROUND OF THE INVENTION

1. Field of the Invention

The field of the invention is that of filters including at least one capacitance and having a cut-off frequency conditioned by this capacitance.

To be more precise, the invention concerns a device for adjusting a cut-off frequency of a filter including at least one capacitance conditioning the cut-off frequency to be adjusted.

2. Description of the Prior Art

The prior art includes many filters including at least one capacitance, and in particular LC (inductance-capacitance) filters.

These prior art filters including at least one capacitance have various drawbacks.

A first drawback of these prior art filters is that low cut-off frequencies require high capacitance values. Low-frequency filtering therefore entails the use of high value capacitors which are large in size and therefore difficult to integrate, for example in an ASIC.

A second drawback of these prior art filters is that it is very difficult to adjust their cut-off frequency or frequencies because the components used, and in particular the capacitor(s), are usually slightly different from the standard components used in the design process.

A third drawback of these prior art filters is that they have a high power consumption because of their operational amplifier based closed loop design. The high consumption is due to the fact that the operational amplifier must have a gain-bandwidth product that is very much greater than the range of frequencies that are actually to be processed, to prevent leakage current short-circuiting the amplifier via passive components in the feedback loop.

The prior art teaches adjustment of the cut-off frequency of a filter by multiplying a capacitance of the filter by a variable coefficient.

The capacitor can therefore have a low capacitance and a small size because it is intended that its capacitance should be multiplied by a variable coefficient, the value of this variable coefficient depending on the required cut-off frequency of the filter. In other words, even for very low frequency filtering requiring a high capacitance value, a low capacitance value can be used because the multiplier means of the adjustment device produce the high value from the low value by multiplying it by a variable coefficient.

The prior art also includes capacitance multiplier means including current amplifier means for amplifying a current passing through the capacitance.

Accordingly, the filter does not include any operational amplifiers and its power consumption is reduced compared to prior art filters using a design based on operational amplifiers.

SUMMARY OF THE INVENTION

The present invention consists in a device for multiplying a capacitance by a variable coefficient, for example for adjusting the cut-off frequency of a filter including said capacitance, said device including current amplifier means for amplifying a current flowing through said capacitance which is floating between first and second predetermined points, said current amplifier means including a differential current amplifier.

In a first embodiment of the intention said differential current amplifier has a first input receiving a current representative of the current flowing through said capacitance, a second input that is not connected, an inverting first output at which the gain is a first differential current gain G and which is connected to said first predetermined point, and a follower second output at which the gain is a second differential current gain G+1 and which is connected to said second predetermined point.

Alternatively, in this first embodiment of the invention said current amplifier means further include a current conveyor, said capacitance is connected on a first side to said first predetermined point and on a second side to an input of said current conveyor for current to be amplified, said current conveyor has said input for current to be amplified connected to the second side of said capacitance, an inverting current output connected to a first input of said differential current amplifier and a control input connected to said second predetermined point, and said first input of said differential current amplifier is connected to said inverting current output of said current conveyor.

The asymmetry of the differential current amplifier output currents is the result of the necessity to have the same capacitance at the predetermined points between which the capacitance of the filter floats, and therefore the same currents on either side of the dummy capacitance constituted by the combination of the capacitance of the filter, the current conveyor and the differential current amplifier. If the capacitance of the filter is C, this dummy capacitance is (G+1).C. The advantages of this structure include those of the differential current amplifier, i.e. low noise, low offset, high bandwidth, good linearity and good gain accuracy. The good linearity and good gain accuracy enable accurate adjustment of the cut-off frequency of the filter.

In another embodiment of the invention, said current amplifier means further include an additional capacitance substantially identical to said capacitance of said filter, said capacitance of said filter being connected on a first side to said first predetermined point, said additional capacitance being connected on a first side to said second predetermined point, said differential current amplifier having a first input receiving a current representative of the current flowing through said capacitance of said filter, a second input receiving a current representative of the current flowing through said additional capacitance, an inverting first output connected to said first predetermined point and a follower second output connected to said second predetermined point, the gain at said first and second outputs of said differential current amplifier being the same differential current gain.

Alternatively, in this other embodiment of the invention, said current amplifier means further include a first current conveyor having an input for current to be amplified connected to said second side of said capacitance of said filter, an inverting current output connected to a first input of said differential current amplifier and a control input connected to said second predetermined point, and a second current conveyor having an input for current to be amplified connected to said second side of said additional capacitance, an inverting current output connected to a second input of said differential current amplifier and a control input connected to said first predetermined point, said first input of said differential current amplifier is connected to said inverting output of said first current conveyor and said second input of said second differential current amplifier is connected to said inverting current output of said second current conveyor.

This solution is easier to implement than the previous solution because the gain is the same at the two outputs of the differential current amplifier. If the capacitance of the filter and the additional capacitance are both C/2 and if the gain at each of the two outputs of the differential amplifier is G the dummy capacitance constituted by the combination of the capacitance of the filter and the additional capacitance, the two current conveyors and the differential current amplifier is (G+½).C.

Implementation of devices in which the capacitance of the filter is floating is more difficult than those in which the capacitance is referred to ground. Nevertheless, these implementations are very important as they enable the implementation of an entirely differential filter, with all the implied advantages of this (including low noise and low offset).

Preferably, said differential current amplifier includes:

means for generating a common mode bias current, a translinear multiplier receiving on two inputs said common mode bias current and a differential mode current to be amplified and supplying at two outputs an amplified differential mode current, means for biasing said translinear multiplier in accordance with said bias current received by said translinear multiplier, and means for compensating the common mode current at said outputs of said translinear multiplier, and further includes means for varying the gain of said translinear multiplier.

Accordingly, the implementation of the amplifier itself is novel in that a translinear multiplier is used. Translinear multipliers are generally used to reproduce complex mathematical functions or in mixers.

The translinear multiplier biasing means achieve good gain accuracy and the common mode current compensator means achieve very good common mode rejection.

In a preferred embodiment of the invention, said translinear multiplier includes at least two differential pairs of output transistors in parallel, said means for varying the gain of said translinear multiplier are means for activating/deactivating each of said differential pairs of output transistors of said translinear multiplier and said variable capacitance multiplier coefficient depends on the number of differential pairs of output transistors activated by said activation/deactivation means.

Accordingly, by wiring a plurality of selectively activated differential pairs in parallel a variable and optionally programmable gain is obtained.

In one embodiment of the invention said means for varying the gain of the translinear multiplier vary said common mode bias current received by said translinear multiplier at its two inputs.

Accordingly, the gain of the translinear multiplier varies in accordance with the bias current and the control loop of the filter can be entirely analog. Moreover, if bipolar transistors are used and if the common mode current is negligible the gain varies as a linear function of the bias current.

Said differential current amplifier advantageously comprises transistors selected from the group comprising bipolar transistors and MOS transistors.

In accordance with another feature of the invention, a device for adjusting the cut-off frequency of a filter includes at least one capacitance and means for multiplying said capacitance by a variable coefficient under the control of control means wherein said filter is of the type receiving a wanted signal to be filtered continuously and includes:

means for generating a reference signal, a calibration filter substantially identical to said filter and including at least one capacitance substantially identical to said capacitance of said filter, said calibration filter receiving said reference signal and supplying a filtered reference signal, and additional multiplier means substantially identical to said means for multiplying the capacitance of said filter and adapted to multiply the capacitance of said calibration filter by a variable coefficient, and wherein said control means for said means for multiplying the capacitance of said filter also control said additional means for multiplying the capacitance of said calibration filter and include means for analyzing said filtered reference signal, said analyzer means supply to said means for multiplying the capacitance of said filter and to said additional means for multiplying the capacitance of said calibration filter a signal for correcting said multiplier coefficient for the capacitance of said filter and for the capacitance of said calibration filter.

Because the filter receives a wanted signal to be filtered at all times, its operation cannot be interrupted in order to calibrate it. An additional or "calibration" filter is therefore used, paired with the filter and enabling calibration without interruption of operation of the filter.

The capacitance of the calibration filter is modified by a feedback correction loop on the basis of the output of the calibration filter, this loop including the means for analyzing the filtered reference signal and the additional multiplier means. On the other hand, the capacitance of the filter is not modified by a feedback correction loop on the basis of the output of the filter. The multiplier means for the capacitance of the filter receive the same multiplier coefficient correction signal as the additional multiplier means for multiplying the calibration filter capacitance. This correction signal represents, to some degree, the result of the calibration of the calibration filter, and is used simultaneously to adjust the cut-off frequency of the filter and the cut-off frequency of the calibration filter.

In accordance with another feature of the invention, a device for adjusting the cut-off frequency of a filter includes at least one capacitance and means for multiplying said capacitance by a variable coefficient under the control of multiplier means wherein said filter is of the type receiving a wanted signal to be filtered intermittently and includes:

means for generating a reference signal, multiplexer means receiving said wanted signal to be filtered and said reference signal and supplying a multiplexed signal in which said reference signal is interleaved between the discontinuous time intervals in which said wanted signal to be filtered is present, said filter receiving said multiplexed signal and supplying either a filtered wanted signal when it receives said wanted signal to be filtered or a filtered reference signal when it receives said reference signal, and wherein said control means for said means for multiplying the capacitance of said filter include means for analyzing said filtered reference signal, said analyzer means supplying to said multiplier means at least one signal for correcting said coefficient for multiplication of the capacitance of said filter.

Differing in this regard from the filter in the embodiment previously described, the filter receives a wanted signal to be filtered only intermittently. It is therefore possible to calibrate the filter during "idle" phases (i.e. phases in which it is not receiving any wanted signal to be filtered). Thus no calibration filter is needed in this second embodiment of the invention. The cut-off frequency adjustment is more accurate than in the first embodiment of the invention since there is no longer any constraint associated with the pairing of the filter and the calibration filter.

The capacitance of the filter is modified by a feedback correction loop including the means for analyzing the filtered reference signal and the multiplier means.

With regard to the compensator loop including the means for analyzing the filtered reference signal and the means for multiplying the capacitance of the filter, the invention has three preferred embodiments.

In a first preferred embodiment of the compensator loop said reference signal is a time signal and said means for analyzing said filtered reference signal include:

means for comparing, after a predetermined time interval running from the start of said time signal, the value characteristic of said filtered reference signal with a predetermined threshold value, and means for modifying said signal for correcting said multiplier coefficient in accordance with said required cut-off frequency and a comparison result supplied by said comparator means.

Accordingly, in the case of a low-pass filter, said characteristic value of the filtered reference signal is below said predetermined threshold value when the cut-off frequency of the filter is less than a required cut-off frequency and above or equal to said predetermined threshold value otherwise. On the other hand, in the case of a high-pass filter, the inequalities are reversed.

For example, the reflection signal is a step or a pulse and the characteristic value of the filtered reference signal is a voltage. Accordingly, the analyzer means detect if the output voltage of the filter has reached a predetermined threshold value after a predetermined time interval. If not, the cut-off frequency of the filter is less than a required cut-off frequency and the cut-off frequency of the filter must be increased by modifying the coefficient by which the capacitance of the filter is multiplied.

Said means for analyzing the filtered reference signal advantageously modify said multiplier coefficient correction signal by iteration until said filter cut-off frequency is greater than or equal to said required cut-off frequency. Accordingly, the cut-off frequency of the filter is incremented on each iteration.

In a second preferred embodiment of the compensation loop, said reference signal has a frequency substantially equal to a required cut-off frequency for said filter and said means for analyzing said filtered reference signal include:

means for detecting the maximal amplitude of said filtered reference signal, means for comparing said maximal amplitude of said filtered reference signal with a predetermined threshold value, and means for modifying said signal for correcting said multiplier coefficient in accordance with said required cut-off frequency and a comparison result supplied by said comparator means.

Accordingly, in the case of a low-pass filter, said maximal amplitude of the filtered reference signal is below said predetermined threshold amplitude when the cut-off frequency of the filter is less than said required cut-off frequency and above or equal to said predetermined threshold amplitude otherwise.

Said means for analyzing the filtered reference signal advantageously modify said multiplier coefficient correction signal by continuous control until said filter cut-off frequency is greater than or equal to said required cut-off frequency.

Accordingly, the filter cut-off frequency is varied continuously, rather than by iteration (incrementally). In this embodiment compensation is in the analog domain whereas in the first embodiment it was in the digital domain.

In a third preferred embodiment of the compensator loop, said filter is a second order filter having a phase-shift of substantially $\pi/2$ for a frequency substantially equal to its cut-off frequency, said reference signal has a frequency substantially equal to a required cut-off frequency for said filter, the device includes phase-shifter means receiving said reference signal and supplying a comparison signal phase-shifted approximately $\pi/2$ relative to said reference signal, and said means for analyzing said filtered reference signal include:

means for comparing the phase of said filtered reference signal and said comparison signal, and means for modifying said signal for correcting said multiplier coefficient in accordance with required cut-off frequency and a comparison result supplied by said comparator means.

Accordingly, in the case of a low-pass filter, the phase of said filtered reference signal is less than the phase of said comparison signal when the cut-off frequency of the filter is less than said required cut-off frequency and greater than or equal to the phase of said comparison signal otherwise.

The second order filter can be any prior art filter (Butterworth filter, Tchebichev filter, etc).

As the phase-shift is equal to $\pi/2$ at the cut-off frequency of any filter, this eliminates a parameter (generally called z) which has an important influence on the amplitude near the cut-off frequency. Consequently, the reference signal can be supplied by a quartz crystal oscillator, achieving high accuracy in adjustment of the cut-off frequency.

Said phase comparator means being of the type supplying a value proportional to the phase difference between said filtered reference signal and said comparison signal, said means for analyzing the filtered reference signal advantageously modify said multiplier coefficient correction signal by continuous control until said filter cut-off frequency is greater than or equal to said required cut-off frequency.

Accordingly, the compensation loop is analog and the cut-off frequency of the filter is modified continuously.

In one embodiment of the invention, said phase comparator means being of the type supplying information indicating if the phase of said filtered reference signal is less than the phase of said comparison signal or not, said means for analyzing the filtered reference signal modify said multiplier coefficient correction signal by iteration until said filter cut-off frequency is greater than or equal to the required cut-off frequency.

In this case the compensation loop is digital and the cut-off frequency of the filter is modified by successive approximations.

The invention also consists in a filter including devices as defined above.

7

Other features and advantages of the invention will emerge from a reading of the following description of various preferred embodiments of the invention given by way of non-limiting illustrative example only with reference to the appended drawings.

DETAILED DESCRIPTION OF THE PREFERRED EMBODIMENTS

The invention concerns a device for multiplying a capacitance by a variable coefficient, in particular for adjusting a cut-off frequency of a filter including this capacitance. The invention can be utilized with any filter including at least one capacitance and whose cut-off frequency is conditioned by that capacitance.

Figure 1:
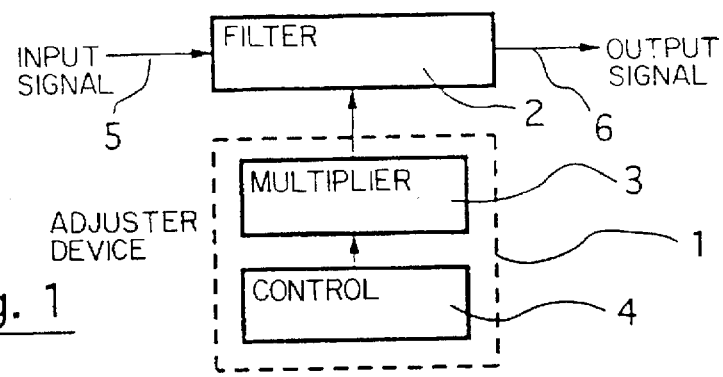
FIG. 1 is a block diagram of a filter and a device for adjusting a filter cut-off frequency.

As shown in the FIG. 1 diagram, the adjuster device 1 acts on the filter 2. The adjuster device 1 receives an input signal 5 to be filtered and supplies a filtered output signal 6. It includes means 3 for multiplying the capacitance of the filter 2 and control means 4 controlling the multiplier means 3.

Under the control of the control means, the multiplier means 3 multiply the capacitance (C) of the filter 2 by a variable multiplier coefficient (k). The capacitance C of the filter is therefore replaced by a dummy capacitance (k.C) dependent on the multiplier coefficient k.

In other words, the capacitance C is replaced by a structure comprising the capacitance C of the filter 2 and the adjuster device 1, this structure behaving like a dummy capacitance k.C. The value of the multiplier coefficient k is controlled by the control means so that the cut-off frequency of the filter 2 is substantially equal to a predetermined required cut-off frequency.

In the remainder of the description the multiplier means, 3 comprise current amplifier means and multiplication of the capacitance C of the filter 2 by the coefficient k to obtain the dummy capacitance k.C is achieved by amplification of the current flowing through the capacitance C of the filter.

The capacitance of the filter 2 can be either referred to ground or floating between two predetermined points.

Figures 2A, 2B:
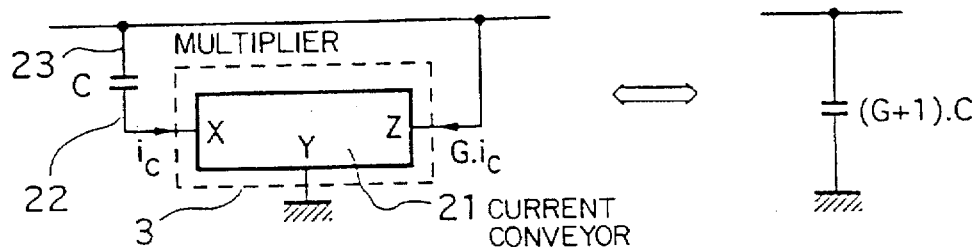
FIG. 2A is a simplified block diagram of one embodiment of capacitance multiplier means included in FIG. 1, corresponding to the situation in which the capacitance of the filter is referenced to ground.
FIG. 2B is a diagram equivalent to the FIG. 2A diagram.

FIG. 2A is a simplified block diagram of one embodiment of the multiplier means 3 shown in FIG. 1. This embodiment corresponds to the situation in which the capacitance C of the filter 2 is referred to ground.

In this first embodiment the means 3 for multiplying the capacitance C of the filter comprise a current conveyor 21. The current conveyor has an input X for the current $i_c$ to be amplified connected to a second side 22 of the capacitance C, an inverting output Z for the amplified current $G.i_c$ connected to a first side 23 of the capacitance C and a control input Y connected to ground (the control input Y in fact receives a reference voltage from the input X for the current to be amplified, this reference voltage being the ground voltage in this first embodiment). If G is the gain at the amplified current output Z, the equivalent dummy capacitance is $(G+1).C$, as shown in FIG. 2B. In other words, the coefficient k by which the capacitance C of the filter is multiplied is $G+1$.

Figure 3:
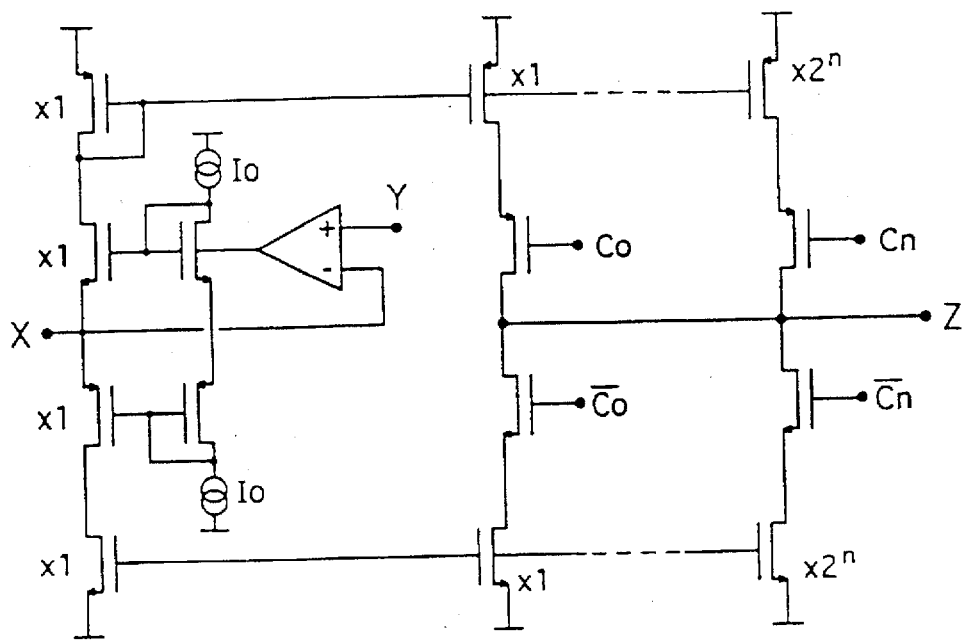
FIG. 3 is a simplified circuit diagram of a preferred embodiment of the current conveyor included in FIG. 2A.

FIG. 3 is a simplified circuit diagram of a preferred embodiment of the current conveyor 21. This circuit diagram, well known to the person skilled in the art, includes the inputs X and Y and the output Z. With n successive transistor stages and n=3 the gain at the amplified current output Z can vary between 0 and 15, in accordance with the values of n pairs of control voltages $(C_i, \overline{C_i})_{i\in[1,n]}$ of the n transistor stages.

Figures 4A, 4B:
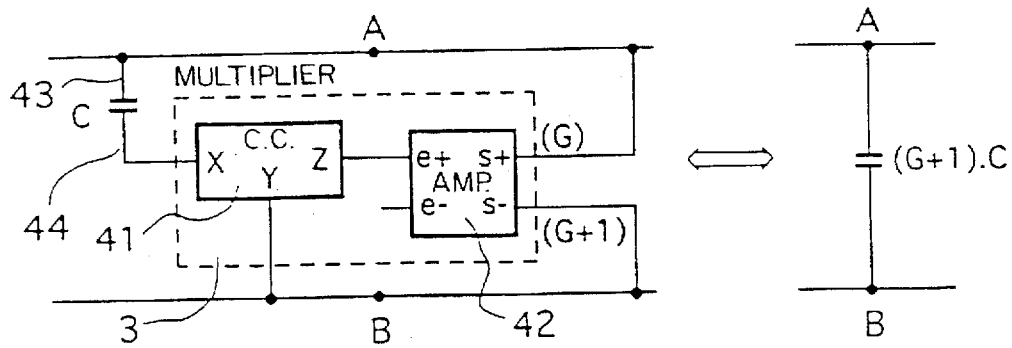
FIG. 4A is a simplified block diagram of one embodiment of the capacitance multiplier means included in FIG. 1, corresponding to the situation in which the capacitance of the filter is floating between two predetermined points.
FIG. 4B is a diagram equivalent to the FIG. 4A diagram.

FIG. 4A is a simplified block diagram of a first preferred embodiment of the multiplier means 3 shown in FIG. 1, this embodiment corresponding to the situation in which the capacitance C of the filter 2 is floating between two predetermined points A and B.

In this embodiment the means 3 which multiply the capacitance C of the filter comprise a current conveyor 41 and a differential current amplifier 42.

The capacitance C of the filter has a first side 43 connected to the first predetermined point A and a second side 44 connected to the input X of the current conveyor 41 for the current to be amplified.

The current conveyor 41 can be of the type described previously with reference to FIG. 3 and includes the input X for the current to be amplified connected to the second side 44 of the capacitance C, an inverting output Z for the amplified current connected to a first input $e^+$ of the differential current amplifier 42 and a control input Y connected to the second predetermined point B.

The differential current amplifier 42 includes the first input $e^+$ connected to the inverting amplified current output Z of the current conveyor 41, a second input $e^-$ which is not connected, a follower first output s⁺ which the first differential current gain is G and which is connected to the first predetermined point A and an inverting second output s⁻ at which the second differential current gain is G+1 and which is connected to the second predetermined point B.

As shown in FIG. 4B, the equivalent dummy capacitance is (G+1).C. In this second embodiment, the relative asymmetry of the respective gains G and G+1 at the outputs s⁺ and s⁻ of the differential current amplifier 42 is the result of the need to see the same capacitance at the two predetermined points A and B and therefore to have the same currents on either side of the dummy capacitance (G+1).C.

Figures 5A, 5B:
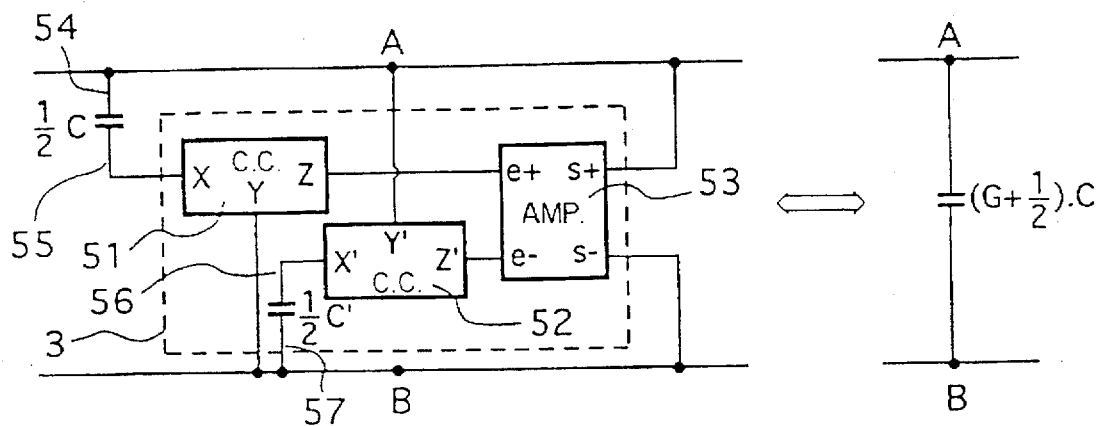
FIG. 5A is a simplified block diagram of another embodiment of the capacitance multiplier means included in FIG. 1, corresponding to the situation in which the capacitance of the filter is floating between two predetermined points.
FIG. 5B is a diagram equivalent to the FIG. 5A diagram.

FIG. 5A is a simplified block diagram of a second preferred embodiment of the multiplier means 3 shown in FIG. 1, this embodiment also corresponding to the situation in which the capacitance C of the filter is floating between the two predetermined points A and B.

In this embodiment, the means 3 for multiplying the capacitance (C/2) of the filter comprise first and second current conveyors 51 and 52, an additional capacitance C'/2 substantially identical to said capacitance C/2 of the filter (C=C') and a differential current amplifier 53.

The capacitance C of the filter is connected on one side 54 to the first predetermined point A and on the second side 55 to an input X for current to be amplified of the first current conveyor 51.

The additional capacitance C' is connected on one side 57 to the second predetermined point B and on the other side 56 to an input X' for current to be amplified of the second current conveyor 52.

The first current conveyor 51 has the input X for current to be amplified connected to the second side 55 of the capacitance C'/2 of the filter, an inverting amplified current output Z connected to a first input e⁺ of the differential current amplifier 53 and a control input Y connected to the second predetermined point B.

The second current conveyor has the input X' for current to be amplified connected to the second side 56 of the additional capacitance C'/2, an inverting amplified current output Z' connected to a second input e⁻ of the differential current amplifier 53 and a control input Y' connected to the first predetermined point A.

The differential current amplifier 53 has the first input e⁺ connected to the inverting amplified current output Z of the first current conveyor 51, the second input e⁻ connected to the inverting amplified current output Z' of the second current conveyor 52, an inverting first output s⁺ connected to the first predetermined point A and a follower second output s⁻ connected to the second predetermined point B.

In this embodiment, the differential current gain G is the same at the first and second outputs s⁺ and s⁻ of the amplifier 53. As shown in FIG. 5B, the equivalent dummy capacitance is (G+½).C.

Figure 6:
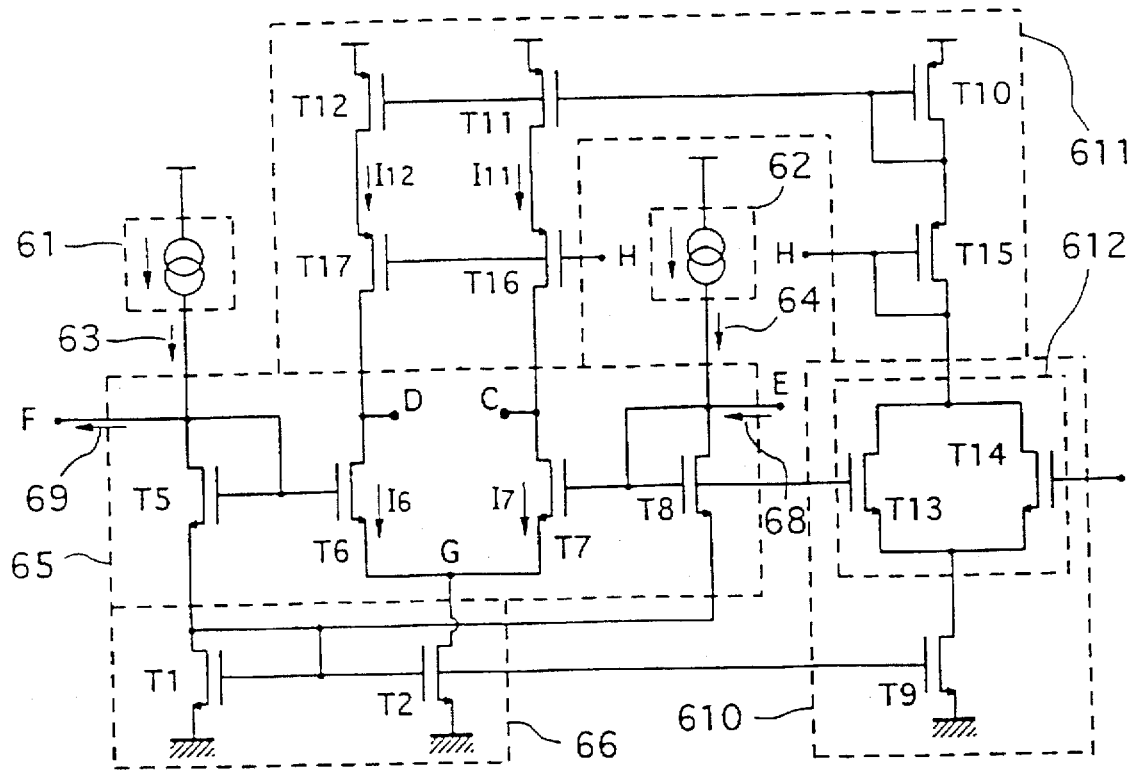
FIG. 6 is a simplified circuit diagram of a preferred embodiment of the differential current amplifier included in FIG. 5A.

FIG. 6 is a simplified electrical circuit diagram of a preferred embodiment of the differential current amplifier 53. The differential current amplifier 53 comprises:

means 61, 62 for generating a common mode bias current 63, 64;

a translinear multiplier 65;

means 66 for biasing the translinear multiplier 65, and means 610, 611 for compensating the common mode current at the output of the multiplier 65.

The common mode bias current generator means 61, 62 are current sources or resistors, for example.

The translinear multiplier 25 has two differential inputs E, F and two differential outputs C, D. At the two inputs E, F it receives the common mode bias current 63, 64 and a differential mode current to be amplified 68, 69. At the two differential outputs C, D it supplies an amplified differential mode current. The translinear multiplier 65 includes a pair of input transistors T5, T8 and a differential pair of output transistors T6, T7.

In this example, the transistors used in the translinear multiplier 65 are NMOS transistors and the sources of the output transistors of the differential pair T6, T7 are connected together and constitute a point G at which the amplified currents $I_6$, $I_7$ flowing through the output transistors T6, T7 are added.

The biasing means 66 include a current mirror (T1, T2) by which the translinear multiplier 65 is automatically biased.

The common mode current compensator means 610, 611 have no effect on the differential gain of the translinear multiplier 65 but ensure that the common mode currents (the bias current and any additional current) $I_{11}$, $I_{12}$ that they supply to the output transistors of the translinear multiplier are identical to the bias currents flowing through the output transistors. In other words, using the chosen reference symbols, the compensator means ensure that: $I_{11}=I_7$ and $I_{12}=I_6$. Accordingly, any common mode component (that may exist because the biasing means 26 copy into these output transistors all of the common mode current flowing through the input transistors of the translinear multiplier) is not reflected in the outputs C, D of the amplifier device. The amplifier device therefore shows very good common mode rejection.

In this embodiment, the common mode current compensator means include:

means 610 for copying the common mode bias current flowing through the transistor T2, and means 611 for injecting a current copied by the current copier means 610 into the output transistors T6, T7 of the translinear multiplier 65 (at the terminals of the latter transistors that constitute the differential outputs C, D of the amplifier device).

The common mode current copier means 610 include:

a transistor T9 which cooperates with the transistor T2 of the current mirror (T1, T2) of the biasing means 66 to constitute a new current mirror; and means 612 (for example two transistors T13, T14) for maintaining a constant voltage at the drain of the transistor T9. Accordingly, voltage fluctuations due to the differential current are eliminated and the current copy is enhanced.

The function of the transistor T9 is to reproduce the common mode bias current which flows through the transistors T2 and T3.

For example, the copy current injector means 611 comprise two first current mirrors (T10, T11), (T10, T12) having a common first branch and two second current mirrors (T15, T16), (T15, T17) in cascade with the first two current mirrors (T10, T11), (T10, T12) and which, among other things, improve the output resistance of the transistors T10, T11, T12 of the first current mirror.

Accordingly, the same common mode bias current $I_{11}$, $I_{12}$ flows through the two transistors T11, T12 and then the two transistors T16, T17 before reaching the two differential outputs C, D of the amplifier device. These currents $I_{11}$, $I_{12}$ are equal to the currents $I_6$, $I_7$ flowing through the output transistors T6, T7 of the translinear multiplier 65. This guarantees very good common mode rejection.

The transistors used in this embodiment of the amplifier are MOS transistors. It is nevertheless clear that an amplifier of this kind can be implemented using bipolar transistors, there being no major problem for the person skilled in the art in changing from MOS transistors to bipolar transistors.

In accordance with the invention, the means 3 for multiplying the capacitance also include means for varying the gain of the translinear multiplier 65.

Figure 7:
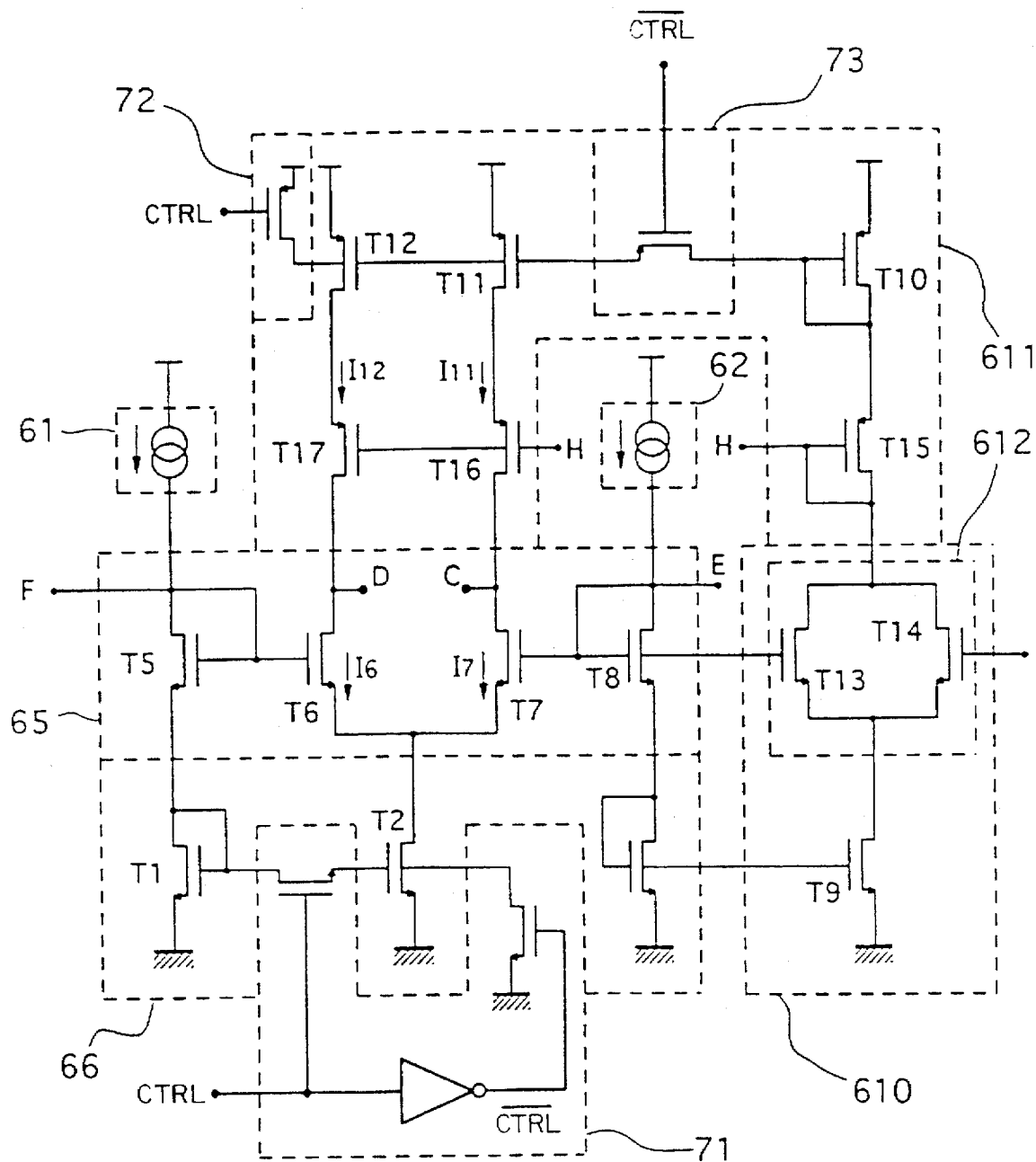
FIG. 7 is based on FIG. 6 and is a simplified circuit diagram of a preferred embodiment of means for varying the gain of the translinear multiplier included in FIG. 6.

FIG. 7 is based on the FIG. 6 diagram and shows a preferred embodiment of the means for varying the gain of the translinear multiplier 65.

In this embodiment, to vary the gain, a plurality of differential pairs of output transistors (T6, T7) of the translinear multiplier 65 are wired in parallel and each differential pair can be activated selectively by associated activation/ deactivation means 71, 72, 73. These activation/deactivation means operate as switches. When they receive a control signal at a low level (0 V) the activation/deactivation means associated with a differential pair deactivate that differential pair which then has a null gain. Otherwise they activate it.

There are the same number of activation/deactivation means, and therefore of control signals, as differential pairs wired in parallel. Note that for simplicity only one differential pair (T6, T7) and the transistors T11, T12, T16, T17, T2 which enable it to operate and the associated control means 71 through 73 are shown. The set of values of the control signals at a given time constitutes a binary control word.

In the specific instance where the transistors of the differential pairs have sizes $2^n$ greater than the input transistors (also of the translinear multiplier) and the bias currents are also $2^n$ times greater, the value of the gain is given directly by the binary control word.

Figure 8:
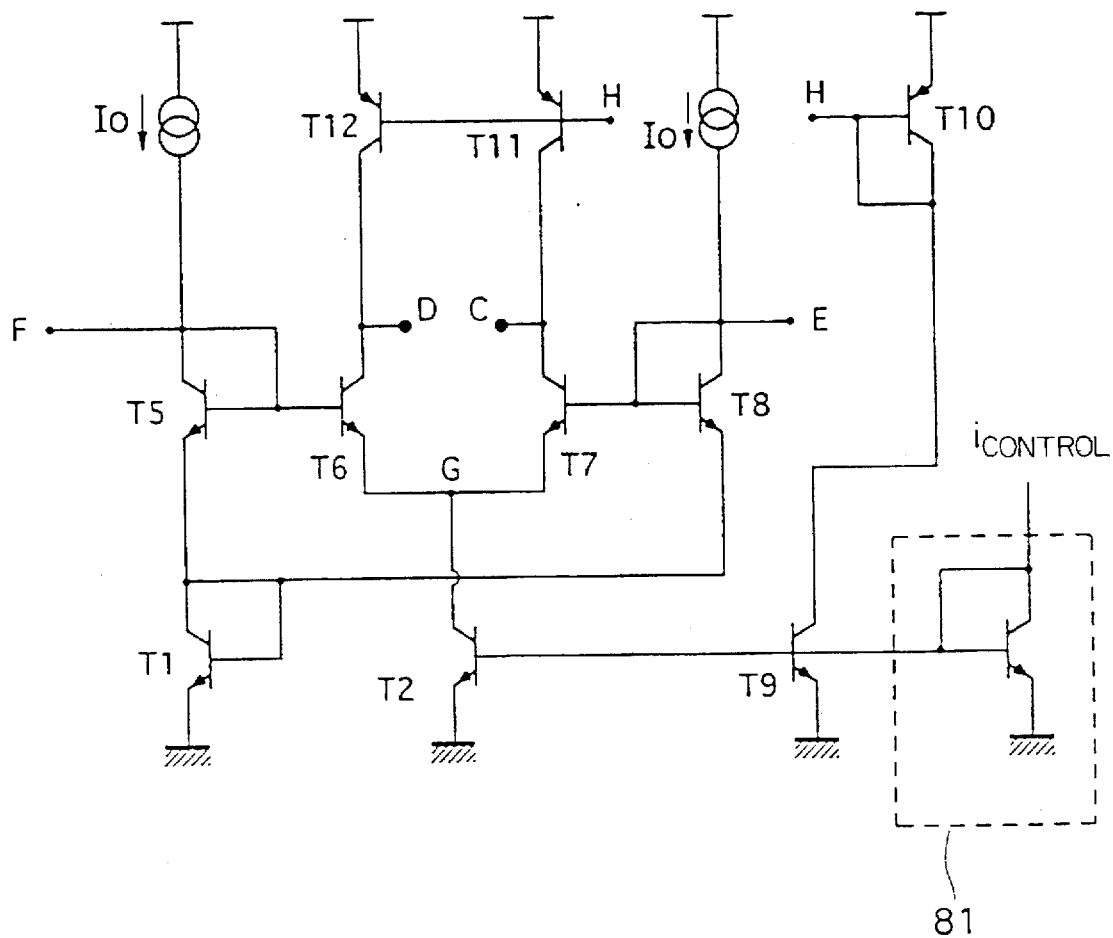
FIG. 8 is a variant of the FIG. 7 circuit diagram.

FIG. 8 is a variant of the FIG. 7 circuit diagram. It corresponds to the situation in which bipolar transistors are used and the common mode current is negligible.

The circuit diagram of the differential current amplifier is substantially identical to that of FIGS. 6 and 7. The only differences are:

the means for copying the common mode bias current do not include means for maintaining a constant voltage at the drain of the current copier transistor T9;

the means for injecting a copied current into the output transistor T6, T7 do not include two second current mirrors in cascade with the first current mirrors.

It is nevertheless clear that in an alternative embodiment the differential current amplifier used in this embodiment could be identical to that used in the embodiment described with reference to FIG. 6.

In this embodiment the means for varying the gain of the translinear multiplier are means 81 for varying the bias current $I_0$ received by the translinear multiplier at its inputs E, F in accordance with a control current $i_{control}$. Accordingly, the gain G varies as a linear function of the bias current $I_0$: $G = i_{control}/I_0$.

The remainder of the description describes two separate methods of adjusting a filter cut-off frequency. Each is associated with a separate mode of operation of the filter.

Figure 9:
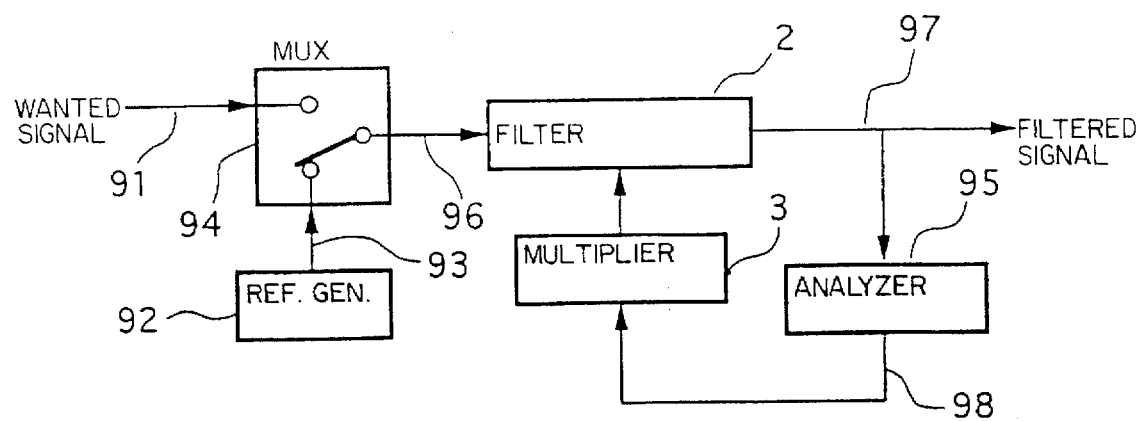
FIG. 9 is a simplified block diagram of a first preferred embodiment of an adjuster device of the invention, corresponding to the situation in which the filter receives a wanted signal to be filtered intermittently.

FIG. 9 is a simplified block diagram of a first preferred embodiment of an adjuster device in accordance with the invention, corresponding to the situation in which the filter 2 receives a wanted signal 91 to be filtered intermittently. This situation corresponds to the GSM digital mobile radio system, for example.

The adjuster device of the invention includes:

means 92 for generating a reference signal 93, multiplexer means 94, means 3 for multiplying the capacitance of the filter, and analyzer means 95.

The multiplexer means 94 receive the wanted signal 91 to be filtered and the reference signal 93 and supply a multiplexed signal 96 consisting of the wanted signal 91 to be filtered during the discontinuous time intervals in which the latter is present and the reference signal 93 during the idle phases between the latter.

Accordingly, the filter 2 which receives the multiplexed signal 96 supplies a filtered signal 97 comprising a filtered wanted signal when the multiplexed signal 96 corresponds to the wanted signal 91 to be filtered and a filtered reference signal when the multiplexed signal 96 corresponds to the reference signal 93.

The analyzer means 95 receive the filtered signal 97 but actively process only the filtered reference signal to supply the multiplier means 3 with a signal 98 for correcting the coefficient by which the capacitance of the filter is multiplied.

Figure 10:
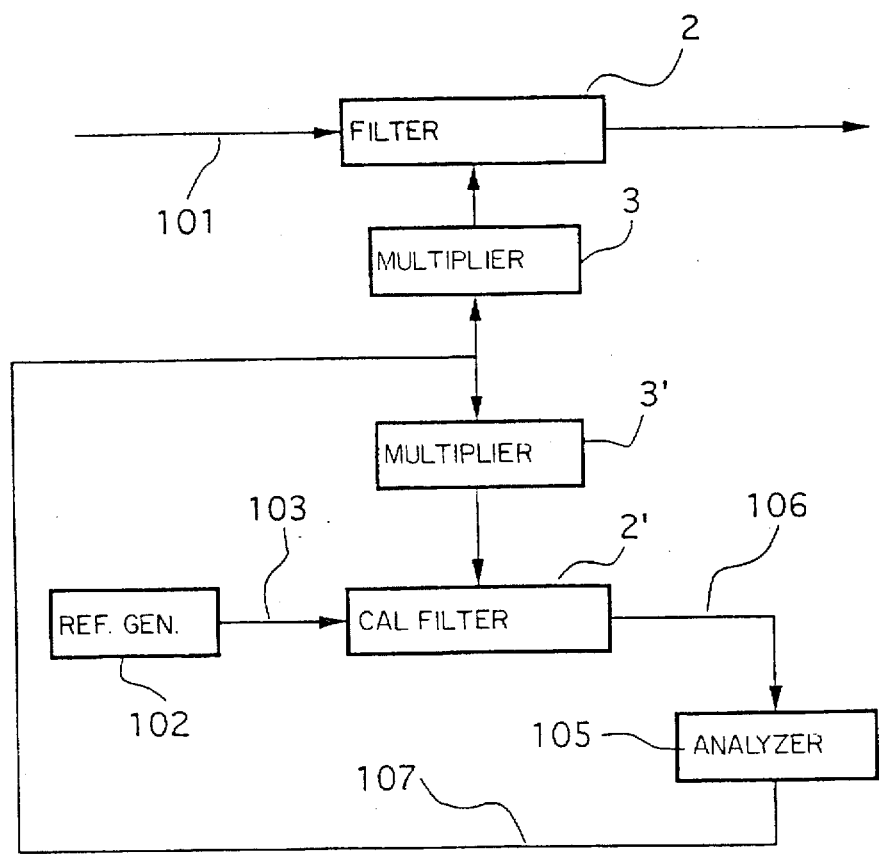
FIG. 10 is a simplified block diagram of a second preferred embodiment of an adjuster device of the invention, corresponding to the situation in which the filter receives a wanted signal to be filtered continuously.

FIG. 10 is a simplified block diagram of a second preferred embodiment of adjuster device of the invention, corresponding to the situation in which the filter 2 receives a wanted signal 101 to be filtered continuously.

The adjuster device of the invention includes:

means for multiplying the capacitance of the filter 2;

means 102 for generating a reference signal 103;

a calibration filter 2';

additional means 3' for multiplying the capacitance of the calibration filter 2'; and analyzer means 105.

The calibration filter 2' is substantially identical to the filter 2 and enables calibration to be carried out without interrupting operation of the filter 2. The calibration filter 2' includes at least one capacitance substantially identical to the capacitance of the filter and its cut-off frequency is therefore substantially identical to that of the filter.

The analyzer means 105 receive a filtered reference signal 106 from the calibration filter 2' and supply a signal 107 for correcting the capacitance multiplier coefficient to the means 3 for multiplying the capacitance of the filter 2 and to the additional means 3' for multiplying the capacitance of the calibration filter 2'.

As shown in FIGS. 9 and 10, in both these embodiments there is a compensator loop. In the first embodiment (FIG. 9) the compensator loop can be driven directly from the output of the filter 2. In the second embodiment (FIG. 10), however, the compensator loop is driven from the output of the calibration filter 2'.

Figure 11:
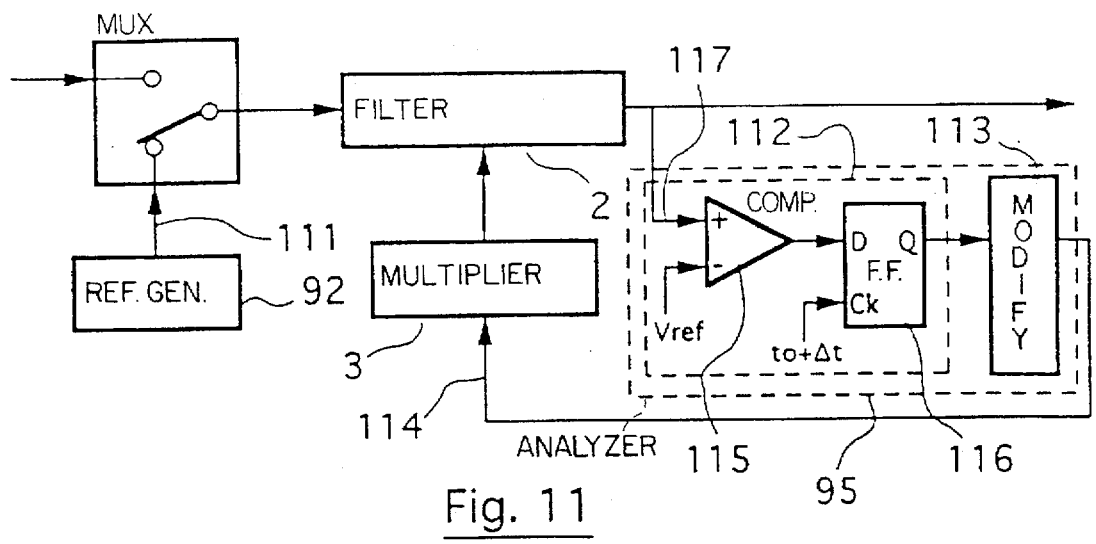
FIG. 11 is a simplified block diagram of a first embodiment of compensator loop included in FIGS. 9 and 10.
Figure 12:
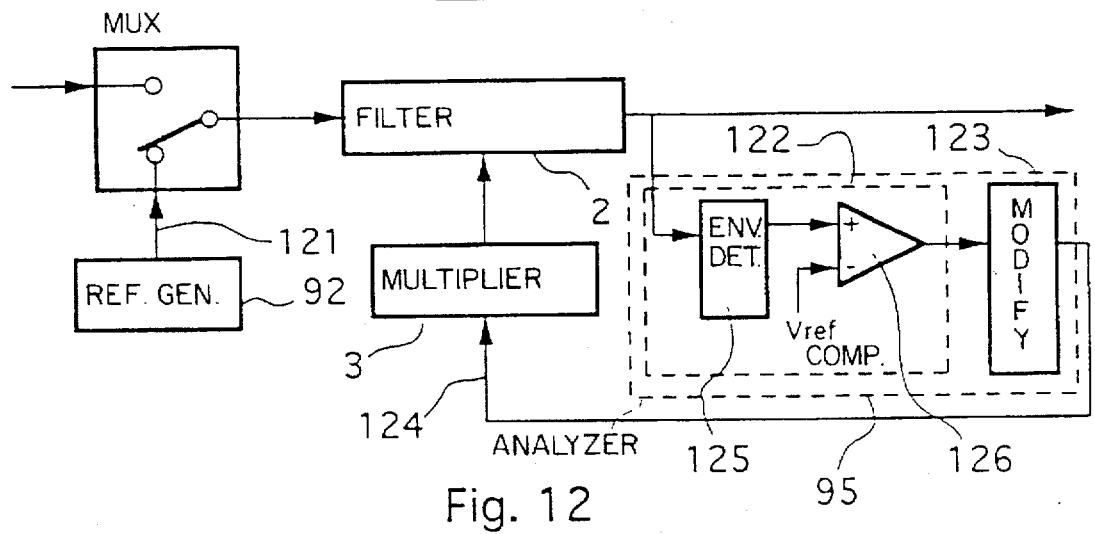
FIG. 12 is a simplified block diagram of a second embodiment of compensator loop included in FIGS. 9 and 10.
Figure 13:
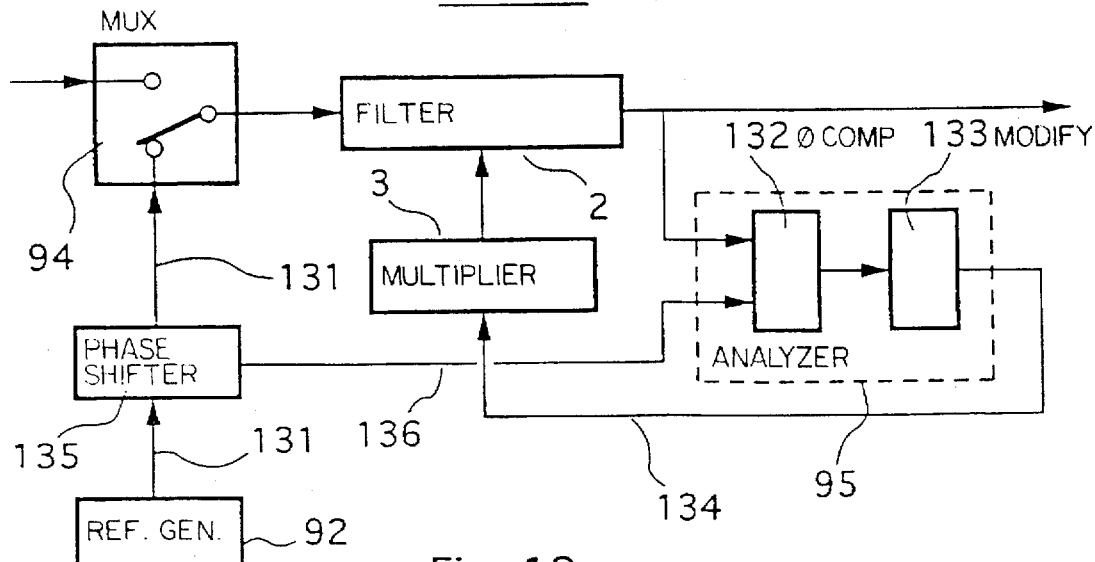
FIG. 13 is a simplified block diagram of a third embodiment of compensator loop included in FIGS. 9 and 10.

FIGS. 11, 12 and 13 each show a separate embodiment of this compensator loop. Although these three embodiments are described in the situation in which the filter receives the wanted signal to be filtered intermittently, it is clear that then can also be implemented in the situation in which the filter receives the wanted signal to be filtered continuously. Likewise, the three embodiments correspond to a low-pass filter but it is clear that the invention can also be implemented in a high-pass filter.

In the first embodiment of the compensator loop shown in FIG. 11 the reference signal is a time signal 111 (a step or a pulse, for example) and the analyzer means 95 include comparator means 112 and means 113 for modifying the signal 114 for correcting the multiplier coefficient of the multiplier means 3.

The comparator means 112 comprise a comparator 115 and a D-type flip-flop 116, for example. When the signal to be filtered is the reference signal 111, the comparator 115 compares the filtered reference signal 117 with a threshold voltage $V_{ref}$ corresponding to the required level for the filtered reference signal 117 after a predetermined time interval $\Delta t$ running from the start $t_0$ of the reference signal 111. The D input of the flip-flop 116 is connected to the output of the comparator 115. This flip-flop receives a clock signal at time $t_0+\Delta_t$ and its output remains at 0 if the voltage of the filtered reference signal 117 has not had time to reach $V_{ref}$, i.e. if the cut-off frequency of the filter is less than a predetermined cut-off frequency. The predetermined cut-off frequency is defined by the threshold voltage $V_{ref}$ and the reference signal.

The means 113 for modifying the signal 114 for correcting the multiplier coefficient are connected to the output Q of the flip-flop 116 and, according to the value at this output Q, instruct the multiplier means 3 how to modify the coefficient for multiplying the capacitance of the filter 2 (and thus the cut-off frequency of the filter 2).

The cut-off frequency of the filter can be modified iteratively until it is equal to a predetermined cut-off frequency. Starting from a low cut-off frequency, for example, iteration is stopped when the cut-off frequency of the filter is greater than or equal to the required cut-off frequency.

The comparator 115 supplies a binary "greater than" or "less than" indication. The means 113 can therefore be digital signal processing means and the accuracy with which the cut-off frequency can be adjusted is limited by the minimum frequency increment between two iterations.

In the second embodiment of the compensator loop shown in FIG. 12 the reference signal 121 is a sinusoid having a known amplitude $V_0$ and a frequency substantially equal to the required cut-off frequency for the filter 2, for example, and the analyzer means 95 comprise comparator means 122 and means 123 for modifying the signal 124 for correcting the multiplier coefficient of the multiplier means 3.

The comparator means 122 comprise an envelope detector 125 and a comparator 126, for example. The envelope detector 125 detects the maximal amplitude $V_1$ of the filtered reference signal. The comparator 126 compares this maximal amplitude $V_1$ with a threshold amplitude $V_{ref}$ corresponding to the required maximal amplitude $V_1$ of the reference signal. If the maximal amplitude $V_1$ is less than the threshold amplitude $V_{ref}$ i.e. if the cut-off frequency of the filter is less than a predetermined cut-off frequency (defined by the reference amplitude $V_{ref}$ and the reference signal), the modifier means 123 (comprising a low-pass filter, for example) instruct the multiplier means 3 to modify the multiplier coefficient for the capacitance of the filter 2 so that the cut-off frequency of the filter is increased.

Accordingly, the cut-off frequency of the filter is modified continuously (and not in increments as previously). Compensation is analog rather than digital. The accuracy with which the cut-off frequency of the filter can be adjusted is limited only by the accuracy of the various analog components (essentially the accuracy of the amplitudes $V_0$ and $V_{ref}$).

In the third embodiment of the compensator loop shown in FIG. 13 the filter is a second order filter whose transfer function is in the form: $1/(1+2z.w/w_c+j^2.w^2/w^2c)$. The phase shift at $w_c$ (i.e. at the cut-off frequency) is equal to $\pi/2$.

The frequency of the reference signal 131 is substantially equal to a required cut-off frequency for the filter 2.

The device of the invention comprises phase-shifter means 135 (for example a Johnson divider) receiving the reference signal 131 and delivering the reference signal 131 to the filter (via the multiplexer means 94) and supplying a comparison signal 136 phase-shifted by about $\pi/2$ relative to the reference signal 131.

The analyzer means 95 include phase comparator means 132 and means 133 for modifying the signal 134 for correcting the multiplier coefficient of the multiplier means 3.

The phase comparator means 132 compare the filtered reference signal and the comparison signal 136 which has the same phase-shift ($\pi/2$ relative to the reference signal 131) that the filtered reference signal must have when the cut-off frequency of the filter is equal to the frequency of the reference signal 131 (i.e. if the cut-off frequency of the filter is equal to the required cut-off frequency).

If the phase comparator means 132 deliver a signal (voltage or current) proportional to the phase difference between the filtered reference signal and the comparison signal, the analyzer means 133 comprise a low-pass filter (and possibly an amplifier), for example, and enable continuous adjustment of the cut-off frequency of the filter 2.

If the phase comparator means 132 deliver a binary "less than" or "greater than" indication the analyzer means 133 are digital signal processing means, for example, and enable adjustment of the cut-off frequency of the filter 2 by successive approximations.

There is claimed:

1. A device for multiplying a capacitance by a variable coefficient to adjust a cut-off frequency of a filter including said capacitance, said cut-off frequency being determined by said capacitance, said device having at least one point connected to a reference, ground potential, said device including current amplifier means for amplifying a current flowing through said capacitance and thereby multiplying said capacitance, said capacitance being connected between first and second predetermined point, which are not connected to said ground potential, said current amplifier means including a differential current amplifier;

wherein said differential current amplifier has a first input receiving a current representative of the current flowing through said capacitance, a second input that is not connected, an inverting first output at which the gain is a first differential current gain G and which is connected to said first predetermined point, and a follower second output at which the gain is a second differential current gain G+1 and which is connected to said second predetermined point.

2. Device according to claim 1 wherein said current amplifier means further include a current conveyor, said capacitance is connected on a first side to said first predetermined point and on a second side to an input of said current conveyor for current to be amplified, said current conveyor has said input for current to be amplified connected to the second side of said capacitance, an inverting current output connected to a first input of said differential current amplifier and a control input connected to said second predetermined point, and said first input of said differential current amplifier is connected to said inverting current output of said current conveyor.

3. Device according to claim 2, wherein one current conveyor further supplies an amplified current at its inverting current output.

4. Device according to claim 1 wherein said differential current amplifier includes transistors selected from the group comprising bipolar transistors and MOS transistors.

5. A device for multiplying a capacitance by a variable coefficient to adjust a cut-off frequency of a filter including said capacitance, said cut-off frequency being determined by said capacitance, said device having at least one point connected to a reference, ground potential, said device including current amplifier means for amplifying a current flowing through said capacitance and thereby multiplying said capacitance, said capacitance being connected between first and second predetermined points, which are not connected to said ground potential, said current amplifier means including a differential current amplifier;

wherein said current amplifier means further include an additional capacitance substantially identical to said capacitance of said filter, said capacitance of said filter being connected on a first side to said first predetermined point, said additional capacitance being connected on a first side to said second predetermined point, said differential current amplifier having a first input receiving a current representative of the current flowing through said capacitance of said filter, a second input receiving a current representative of the current flowing through said additional capacitance, an inverting first output connected to said first predetermined point and a follower second output connected to said second predetermined point, the gain at said first and second outputs of said differential current amplifier being the same differential current gain.

6. Device according to claim 5 wherein said current amplifier means further include a first current conveyor having an input for current to be amplified connected to a second side of said capacitance of said filter, an inverting current output connected to a first input of said differential current amplifier and a control input connected to said second predetermined point, and a second current conveyor having an input for current to be amplified connected to said second side of said additional capacitance, an inverting current output connected to a second input of said differential current amplifier and a control input connected to said first predetermined point, said first input of said differential current amplifier is connected to said inverting output of said first current conveyor and said second input of said second differential current amplifier is connected to said inverting current output of said second current conveyor.

7. Device according to claim 5 wherein said differential current amplifier includes:

means for generating a common mode bias current, a translinear multiplier receiving on two inputs said common mode bias current and a differential mode current to be amplified and supplying at two outputs an amplified differential mode current, means for biasing said translinear multiplier in accordance with said bias current received by said translinear multiplier, and means for compensating the common mode current at said outputs of said translinear multiplier, and wherein said device further includes means for varying the gain of said translinear multiplier.

8. Device according to claim 7 wherein said translinear multiplier includes at least two differential pairs of output transistors in parallel, said means for varying the gain of said translinear multiplier are means for activating/deactivating each of said differential pairs of output transistors of said translinear multiplier and said variable capacitance multiplier coefficient depends on the number of differential pairs of output transistors activated by said activation/deactivation means.

9. Device according to claim 7 wherein said means for varying the gain of said translinear multiplier are means for varying said common mode bias current received by said translinear multiplier at said two inputs.

10. Device for adjusting the cut-off frequency of a filter including at least one capacitance and means for multiplying said capacitance by a variable coefficient under the control of multiplier means wherein said filter receives a wanted signal to be filtered intermittently and includes:

means for generating a reference signal, multiplexer means receiving said wanted signal to be filtered and said reference signal and supplying a multiplexed signal in which said reference signal is interleaved between the discontinuous time intervals in which said wanted signal to be filtered is present, said filter receiving said multiplexed signal and supplying either a filtered wanted signal when it receives said wanted signal to be filtered or a filtered reference signal and when it receives said reference signal, control means, for controlling said means for multiplying said capacitance of said filter and including analyzer means for analyzing said filtered reference signal, said analyzer means supplying to said multiplier means at least one signal for correcting said coefficient for multiplication of said capacitance of said filter.

11. Device for adjusting the cut-off frequency of a filter including at least one capacitance and means for multiplying said capacitance by a variable coefficient under the control of control means wherein said filter receives a wanted signal to be filtered continuously and includes:

means for generating a reference signal, a calibration filter substantially identical to said filter and including at least one capacitance substantially identical to said capacitance of said filter, said calibration filter receiving said reference signal and supplying a filtered reference signal, and additional multiplier means, substantially identical to said means for multiplying the capacitance of said filter for multiplying the capacitance of said calibration filter by a variable coefficient, and wherein said control means for said means for multiplying said capacitance of said filter also control said additional means for multiplying the capacitance of said calibration filter and include means for analyzing said filtered reference signal, said analyzer means supply to said means for multiplying said capacitance of said filter and to said additional means for multiplying said capacitance of said calibration filter a signal for correcting said multiplier coefficient for said capacitance of said filter and for said capacitance of said calibration filter.

12. Device according to claim 11 wherein said reference signal is a time signal and said means for analyzing said filtered reference signal include:

means for comparing, after a predetermined time interval running from the start of said time signal, the value characteristic of said filtered reference signal with a predetermined threshold value, and means for modifying said signal for correcting said multiplier coefficient in accordance with said required cut-off frequency and a comparison result supplied by said comparator means.

13. Device according to claim 12 characterized in that said means for analyzing said filtered reference signal modify said signal for correcting said multiplier coefficient by successive iteration until said cut-off frequency of said filter is substantially equal to said required cut-off frequency.

14. Device according to claim 11 wherein said reference signal has a frequency substantially equal to a required cut-off frequency for said filter and said means for analyzing said filtered reference signal include:

means for detecting the maximal amplitude of said filtered reference signal, means for comparing said maximal amplitude of said filtered reference signal with a predetermined threshold value, and means for modifying said signal for correcting said multiplier coefficient in accordance with said required cut-off frequency and a comparison result supplied by said comparator means.

15. Device according to claim 14 wherein said means for analyzing said filtered reference signal modify said signal for correcting said multiplier coefficient by continuous control until said cut-off frequency of said filter is substantially equal to said required cut-off frequency.

16. Device according to claim 11 wherein said filter is a second order filter having a phase-shift of substantially $\pi/2$ for a frequency substantially equal to its cut-off frequency, said reference signal has a frequency substantially equal to a required cut-off frequency for said filter, the device includes phase-shifter means receiving said reference signal and supplying a comparison signal phase-shifted approximately $\pi/2$ relative to said reference signal, and said means for analyzing said filtered reference signal include:

means for comparing the phase of said filtered reference signal and said comparison signal, and means for modifying said signal for correcting said multiplier coefficient in accordance with required cut-off frequency and a comparison result supplied by said comparator means.

17. Device according to claim 16 wherein said phase comparator means supply a value proportional to the phase difference between said filtered reference signal and said comparison signal and said means for analyzing said filtered reference signal modify said signal for correcting said multiplier coefficient by continuous control until said cut-off frequency of said filter is substantially equal to said required cut-off frequency.

18. Device according to claim 16 wherein said phase comparator means supply an indication of whether the phase of said filtered reference signal is less than the phase of said comparison signal or not and said means for analyzing said filtered reference signal modify said signal for correcting said multiplier coefficient by successive iteration until said cut-off frequency of said filter is substantially equal to said required cut-off frequency.

19. A filter comprising a capacitance, which determines a cut-off frequency of the filter, and a circuit for multiplying the capacitance by a variable coefficient to adjust the cut-off frequency of the filter, said filter having an input and an output, said circuit including current amplifier means for amplifying an input current flowing through said capacitance and thereby multiplying said capacitance, said filter having at least one portion thereof connected to a reference, ground potential said capacitance being connected between first and second predetermined points which are not connected to said ground potential, and said current amplifier means including a differential current amplifier which has a first input receiving a current representative of the current flowing through said capacitance, a second input that is not connected, an inverting first output at which the gain is a first differential current gain G and which is connected to said first predetermined point, and a follower second output at which the gain is a second differential current gain G+1 and which is connected to said second predetermined point.

20. A circuit for multiplying a capacitance by a variable coefficient to adjust a cut-off frequency of a filter including said capacitance which determines the cut-off frequency of said filter, said filter having an input and an output, said circuit having at least one point connected to a reference, ground potential, said circuit including current amplifier means for amplifying a current flowing through said capacitance and thereby multiplying said capacitance, said capacitance being connected between first and second predetermined points, not connected to said ground potential, said current amplifier means including means for equilibrating the currents on either side of the resulting multiplied capacitance;

wherein said current amplifier means further includes an additional capacitance substantially identical to said capacitance of said filter, said capacitance of said filter being connected on a first side to said first predetermined point, said additional capacitance being connected on a first side to said second predetermined point, said means for equilibrating comprising a differential current amplifier having a first input receiving a current representative of the current flowing through said capacitance of said filter, a second input receiving a current representative of the current flowing through said additional capacitance, an inverting first output connected to said first predetermined point and a follower second output connected to said second predetermined point, the gain at said first and second outputs of said differential current amplifier being the same differential current gain.

\* \* \* \* \*